(12) United States Patent
Hill (10) Patent No.: US 6,448,757 B2
(45) Date of Patent: *Sep. 10, 2002

(54) PRECISE DIGITAL FREQUENCY DETECTION

(75) Inventor: Martin Hill, Bentley (AU)

(73) Assignee: Curtin University of Technology, Bentley (AU)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/202,438

(22) PCT Filed: Jun. 27, 1997

(86) PCT No.: PCT/AU97/00407

§ 371 (c)(1),
(2), (4) Date: Feb. 18, 1999

(87) PCT Pub. No.: WO98/00722

PCT Pub. Date: Jan. 8, 1998

(30) Foreign Application Priority Data

Jun. 28, 1996 (AU) .............................................. PO 0720

(51) Int. Cl.[7] ........................ G01R 13/02; G01R 23/02; G01R 23/12
(52) U.S. Cl. ................. 324/76.82; 324/76.39; 324/76.47; 324/76.52
(58) Field of Search ........................... 324/76.39, 76.41, 324/76.52, 76.77, 76.82, 76.47, 76.55, 76.54; 377/106; 327/8, 48, 47

(56) References Cited

U.S. PATENT DOCUMENTS

| | | | | |
|---|---|---|---|---|
| 2,576,900 A | * | 11/1951 | Brockman | 324/76.47 |
| 4,703,448 A | * | 10/1987 | Muething, Jr. | 324/76.82 |
| 4,963,817 A | | 10/1990 | Kohiyama et al. | |
| 5,019,786 A | | 5/1991 | Fairley et al. | |
| 5,189,420 A | * | 2/1993 | Eddy et al. | 324/76.52 |
| 5,844,408 A | * | 12/1998 | Yoshimura et al. | 324/76.52 |

FOREIGN PATENT DOCUMENTS

EP 0 552 601 A2 7/1993

* cited by examiner

Primary Examiner—N. Le
Assistant Examiner—Anjan K. Deb
(74) Attorney, Agent, or Firm—Merchant & Gould, P.C.

(57) ABSTRACT

A digital frequency detector (10) and method for digitally detecting arbitrarily small phase changes between a signal waveform and a reference waveform. Both the reference waveform and the signal waveform are sampled at a rate related to the clock frequency $f_c$, and separately fed into two arrays of simple frequency detectors (12, 14). Each simple frequency detector in each array has a different starting phase with respect to the reference waveform and the signal waveform respectively. Phase slips between the reference waveform and the sampling frequency and phase slips between the signal waveform and the sampling frequency are measured by the detector arrays (12, 14). These phase slips, called "slip events", are combined in circuit (16) which produces an output indicative of phase slips between the reference waveform and the signal waveform. Using this phase slip information, the instantaneous frequency difference between the signal and reference waveforms can be determined.

15 Claims, 6 Drawing Sheets

SAMPLE ● TIME $t_1$

PRECISE DIGITAL FREQUENCY DETECTION

FIELD OF THE INVENTION

The present invention relates to a digital frequency detecting apparatus and method and relates particularly, though not exclusively, to a precise digital frequency detection system for detecting small frequency differences between a signal square wave and a reference waveform.

BACKGROUND TO THE INVENTION

Many methods have been described to measure the frequency of a square wave signal. For the purposes of this document, these methods can be divided into three classes:

(a) Digital methods
(b) Analog methods
(c) Mixed methods employing analog to digital converters with some analog processing of the square wave (for example filtering to convert it to a sine wave).

The prior art digital methods can only detect large phase changes between the signal and reference (typically a whole clock cycle) or they require clock rates much higher than the signal frequency to measure small phase changes. As they need to measure accurately the period of every signal clock cycle, this greatly limits their application. Some methods employ delay line time digitisers to accurately measure the period of every signal clock cycle without resorting to high clock rates. Unfortunately these methods require delay elements with very small and accurate delays, which again limits their application to high signal frequencies. Furthermore, they are only economical when access to custom analog integrated circuit technology is available.

The analog methods are able to detect small phase changes between the signal and reference. Some examples are the quadricorrelator, and classic FM discriminators involving differentiation of the signal by use of tuned filters or time delays. These methods have the usual analog disadvantages of being hard to integrate and requiring precision components and/or tuning when manufactured.

Some examples of mixed analog digital methods are, heterodyning the signal to a much lower frequency whose period can be accurately measured digitally. Converting the square wave to a sine wave by low pass filtering then digitising the waveform using analog to digital converters. There is a significant amount of literature on using the samples to determine the frequency of the signal. These methods require at least some analog processing of the square wave and also an analog to digital converter.

SUMMARY OF THE INVENTION

The present invention was developed with a view to providing a digital frequency detecting apparatus and method that can detect arbitrarily small phase changes between the signal and reference waveforms and that can be implemented with off-the-shelf digital components According to one aspect of the present invention there is provided a digital frequency detecting apparatus for detecting small frequency differences between a signal waveform and a reference waveform, the apparatus comprising:

means for digitally generating reference slip events effectively indicative of phase slips between the reference waveform and a sampling clock signal;
means for digitally generating signal slip events effectively indicative of phase slips between the signal waveform and the sampling clock signal;
means for digitally combining the reference slip events with the signal slip events to produce a digital output indicative of phase slips between the reference waveform and the signal waveform whereby, in use, the magnitude of a frequency difference between the signal and the reference waveforms can be determined from the number of phase slips per unit time.

In a preferred embodiment said means for generating reference slip events comprises an array of simple digital frequency detectors, each simple frequency detector only being capable of detecting a large phase slip between the reference waveform and the sampling clock signal, and each simple frequency detector in the array having a different starting phase with respect to the reference waveform.

Alternatively said means for generating reference slip events comprises a digital logic circuit designed to generate a stream of slip events as if there were a reference waveform present.

Preferably said means for generating signal slip events comprises an array of simple digital frequency detectors, each simple frequency detector only being capable of detecting a large phase slip between the signal waveform and the sampling clock signal, and each simple frequency detector in the array having a different starting phase with respect to the signal waveform.

Typically said combining means effectively subtracts the stream of reference slip events from the stream of signal slip events to produce an output indicative of phase slips between the reference waveform and the signal waveform.

In one embodiment each of said simple frequency detectors comprises a memory element for storing a previous sample and an Exclusive OR gate with inversion to determine if a slip event has occurred. Typically the memory elements in each simple frequency detector are flip flops clocked at predetermined periods with phased clock signals generated by a phased clock generation means. In an alternative embodiment a single Exclusive OR gate with inversion is shared between all the simple frequency detectors and the memory elements are implemented with a shift register.

According to another aspect of the present invention there is provided a digital frequency detecting method for detecting small frequency differences between a signal waveform and a reference waveform, the method comprising:

digitally generating reference slip events effectively indicative of phase slips between the reference waveform and a sampling clock signal;
digitally generating signal slip events effectively indicative of phase slips between the signal waveform and the sampling clock signal; and,
digitally combining the reference slip events with the signal slip events to produce a digital output indicative of phase slips between the reference waveform and the signal waveform whereby, in use, the magnitude of a frequency difference between the signal and reference waveforms can be determined from the number of phase slips per unit time.

In a preferred embodiment said step of digitally generating reference slip events is effected using an array of simple digital frequency detectors, each simple frequency detector only being capable of detecting a large phase slip between the reference waveform and the sampling clock signal, and each simple frequency detector in the array having a different starting phase with respect to the reference waveform.

Alternatively said step of digitally generating reference slip events involves the digital generation of slip events, as if there were a reference waveform present.

Preferably said step of digitally generating signal slip events is effected using an array of simple digital frequency detectors, each simple frequency detector only being capable of detecting a large phase slip between the signal waveform and the sampling clock signal, and each simple frequency detector in the array having a different starting phase with respect to the signal waveform.

Typically said step of digitally combining involves effectively subtracting the stream of reference slip events from the stream of signal slip events to produce an output indicative of phase slips between the reference waveform and the signal waveform.

Although the following description will be given primarily with reference to the detection of small frequency differences between a signal square wave and a reference waveform, it is to be understood that the digital frequency detecting apparatus and method according to the invention can also be used with other signal waveforms and is not limited to square waves.

BRIEF DESCRIPTION OF THE DRAWINGS

In order to facilitate a better understanding of the invention several embodiments of a digital frequency detecting system will now be described in detail, by way of example only, with reference to the accompanying drawings in which.

DETAILED DESCRIPTION OF PREFERRED EMBODIMENTS

Figure 1:
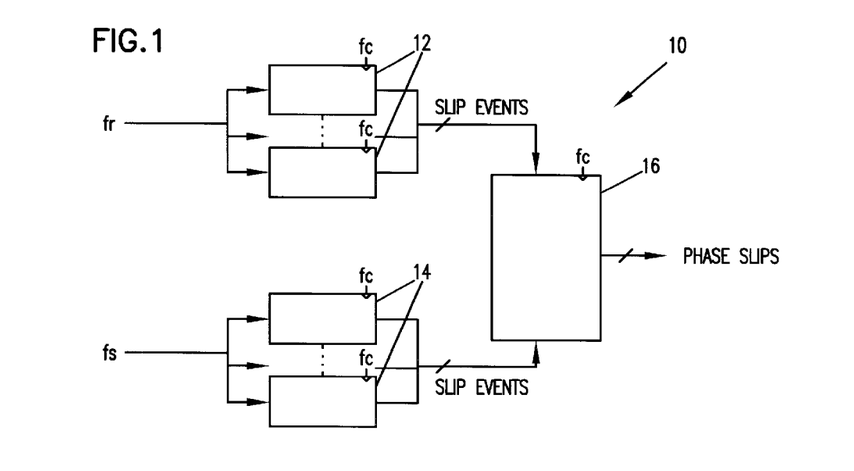
FIG. 1 is a block diagram of one embodiment of a digital frequency detector in accordance with the invention.

One embodiment of a digital frequency detection apparatus and method is illustrated in FIG. 1. The digital frequency detector 10 consists of digital components clocked with a clock of frequency $f_c$, The signal reference waveform $f_r$, and signal waveform $f_s$ are inputs to the digital frequency detector 10. The reference waveform and signal waveform are sampled at a rate related to $f_c$. The samples are converted to digital form using an analog to digital converter incorporated in each simple frequency detector. In its most basic form, the input signal may be a square wave, with the sampler and analog to digital converter being a flip flop. In a serial realisation of the simple frequency detector array (described below with reference to FIG. 14) the analog to digital converter may be shared. The digitised samples of the reference waveform are fed into an array of simple frequency detectors 12. Each simple frequency detector in the array has a different starting phase with respect to the reference waveform. Similarly the digitised samples of the signal waveform are fed into another array of simple frequency detectors 14.

The purpose of the digital frequency detector 10 is to precisely measure the frequency difference between the reference waveform and the signal waveform. The first array of simple frequency detectors 12 measures the phase slips between the reference waveform of frequency $f_r$, and the sampling frequency related to $f_c$. Similarly the second array of simple frequency detectors 14 measures the phase slips between the signal waveform of frequency $f_s$ and the sampling frequency related to $f_c$.

These phase slips from the two arrays of simple frequency detectors, called 'slip events' throughout this specification, are combined in circuit 16. Circuit 16 combines the signal and reference slip events to produce an output indicative of phase slips between the reference waveform and the signal waveform. Using this phase slip information, a system observing the output of the digital frequency detector 10 can determine the instantaneous frequency difference between the signal and reference waveforms. The system observing the output can determine the sign of the frequency difference from the phase slip direction, and the magnitude of the frequency difference from the number of phase slips per unit time.

Figure 2:
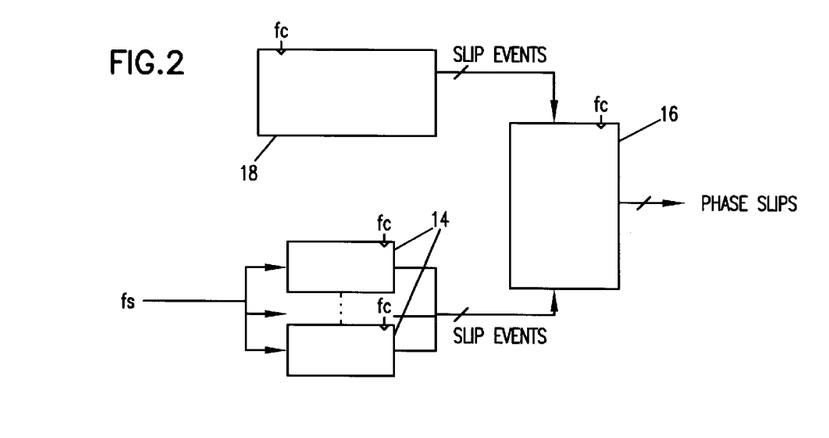
FIG. 2 is a block diagram of another embodiment of a digital frequency detector in accordance with the invention.

In many applications the signal reference waveform will not be present. Instead digital logic will generate a stream of slip events as if there were a signal reference waveform present. In FIG. 2 an alternative embodiment of a digital frequency detection system is illustrated, in which the first array of frequency detectors 12 has been replaced by a digital logic circuit 18 to generate equivalent slip events.

Figure 3:
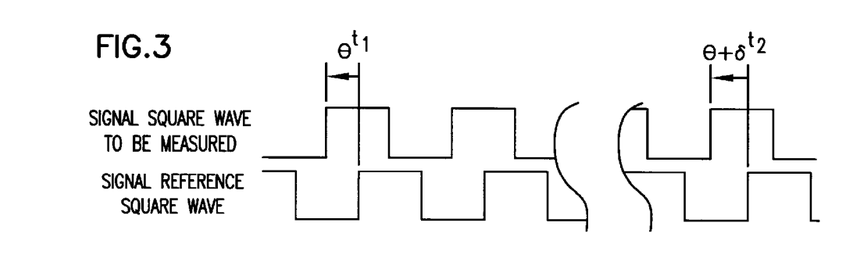
FIG. 3 illustrates graphically the measurement of small relative phase changes caused by a frequency difference in square waves.

FIG. 3 illustrates the task of the digital frequency detector 10 for square waves. In a particular embodiment of a digital frequency detector for square waves each of the simple frequency detectors (12, 14) can only detect a phase slip of $2\pi$ between square waves, but each frequency detector is started off with a different starting phase with respect to the signal being measured. At time $t_1$ the signal leads the signal reference by $\theta$, at time $t_2$ the relative phase lead has increased a small amount to $\theta+\delta$, due to a difference in frequency. The digital frequency detector 10 for square waves must be able to detect these small relative phase changes and signal the appropriate difference in frequency. For the digital frequency detector the difference in frequency between the signal reference with frequency $f_r$ and the signal with frequency $f_s$ is assumed to be small compared to $f_r$. i.e.

$$|f_r - f_s| < f_r \tag{1}$$

So that the phase slipping between the signal reference and the signal occurs over several reference cycles.

Figure 4:
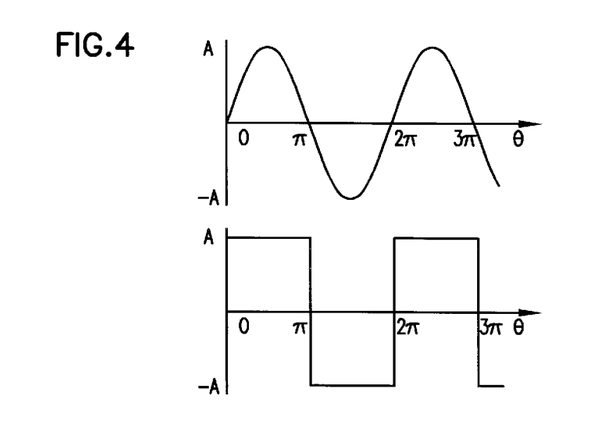
FIG. 4 illustrates graphically the phase of a square wave and sine wave.

The phase of a square wave is shown in FIG. 4. The levels −A and A are mapped into logic levels 0 and 1 respectively when the square wave is sampled by the digital frequency detector. The digital frequency detector for square waves samples the square wave at rate $f_c$. About the only information the digital frequency detector for square waves obtains with two separate samples of the square wave, is that there was either an odd or even number of zero-crossing between the two samples. In contrast, the sine wave waveform contains directly more information, (without further analog processing), about the waveform phase When sampled at discrete times using an analog to digital converter, significant information about the phase of the waveform can be obtained.

Consider a system sampling the signal reference square wave at rate $f_c$.

$$f_r < f_c < 2f_r \tag{2}$$

The phase of the sampling instants given by $$\theta_c = 2\pi f_c t = \omega_c t \tag{3}$$

slips past that of the reference square wave $$\theta_r = 2\pi f_r t = \omega_r t \tag{4}$$

Figure 5:
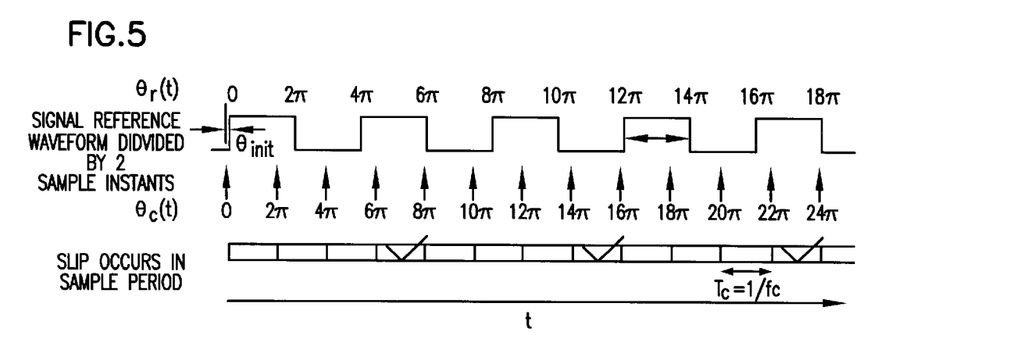
FIG. 5 illustrates a sampling process employed to detect slip events.

To facilitate easy detection of when a phase slip of $2\pi$ occurs between θc and θr, the reference frequency is divided down by two using a flip flop. This also ensures a good mark space ratio in the resulting square wave. The sampling process is shown in FIG. 5. The sampling process starts at time zero and leads the signal reference by $$\theta_{init} = 0^+ \tag{5}$$

The event that is to be identified is when two sample instants fall inside a single reference square wave period. This can be identified by simply checking the last two samples to see if they are the same value, (see FIG. 5). This can logically be accomplished with an Exclusive OR function followed by an inversion. A logical 1 is output from the system to report when one of these events occurs. These events will be referred to as 'slip events'. These slip events occur when $\theta_c$ slips past $\theta_r$ by $2\pi$. The time instants when this occurs are given by $$t_m = \frac{m - \theta_{init}/2\pi}{f_c - f_r} \tag{6}$$

$$m \in Z^+ \tag{7}$$

A slip event will be reported on the sample instants following the time instants given in (6) and (7). The system acts as a frequency detector, the frequency of output pulses being given by $$f_p = f_c - f_r \tag{8}$$

though the system only responds to a phase slip between $f_c$, and $f_r$ of $2\pi$.

Figure 6:
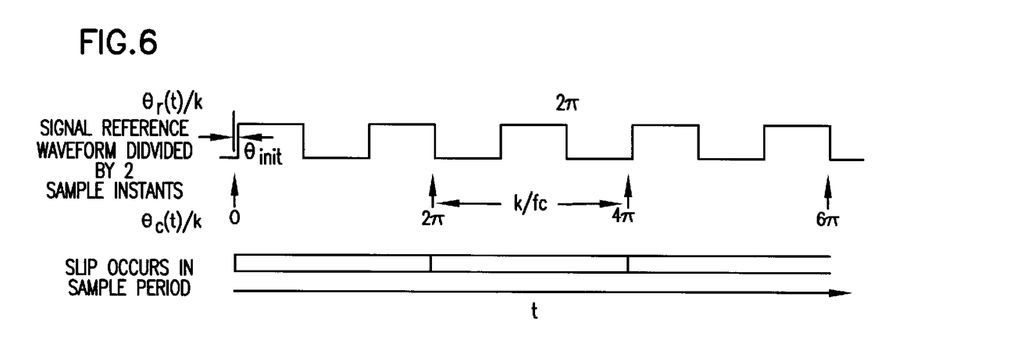
FIG. 6 illustrates a sampling process similar to FIG. 5 except only the kth samples are employed.

Consider now a system where only the $k^{th}$ samples of the signal reference are used and compared. The system is shown in FIG. 6. The event that is to be identified is: for k odd, that two consecutive samples have the same value. Again this can logically be accomplished with the Exclusive OR function followed by an inversion. For k even, that two consecutive samples have different values. This can also logically be accomplished with the Exclusive OR function. Again a pulse is output from the system to report when one of these slip events occurs.

Effectively the two frequencies $f_c/k$ and $f_r/k$ are being compared. The slip events are related to when $\theta_c/k$ slips past $\theta_r/k$ by $2\pi/k$, the time instants when this occurs are given by equations (6) and (7). The slips of $2\pi/k$ between $\theta_c/k$ and $\theta_r/k$ are spaced with period $$\frac{1}{f_c - f_r} \tag{9}$$

The system has a sampling period of $$\frac{k}{f_c} \tag{10}$$

which may be longer than the spacing period (9). When an odd number of these $2\pi/k$ slips occur in a sampling period of $k/f_c$ (i.e. between two consecutive samples) a slip event occurs and is reported by outputting a logical 1. Define p as the floor of the sampling period divided by the $2\pi/k$ slip period $$p = \left\lfloor k \frac{f_c - f_r}{f_c} \right\rfloor \tag{11}$$

If p is even then a sampling period will contain p $2\pi/k$ slips and hence no slip event is reported, or it will contain at times p+1 slips (an odd number) and a slip event is reported. These slip event instants occur when the phase of the $2\pi/k$ slip generating process, $(\omega_c - \omega_r)t$, exceeds p times the phase of the sampling process $\omega_c t/k$ by $2\pi$. The time instants at which this occurs are $$t_m = \frac{m - \theta_{init}/2\pi}{f_c\left(1 - \frac{p}{k}\right) - f_r} \tag{12}$$

$$m \in Z^+ \tag{13}$$

If p is odd then a sampling period will contain p $2\pi/k$ slips and hence a slip event is reported, or it will contain at times p+1 $2\pi/k$ slips (an even number) and a slip event is NOT reported. The instants when a slip event is not reported occur when the phase of the $2\pi/k$ slip generating process, $(\omega_c - \omega_r)t$, exceeds p times the phase of the sampling process $\omega_c t/k$ by $2\pi$. The time instants are given by equations (12) and (13) again.

Figure 7:
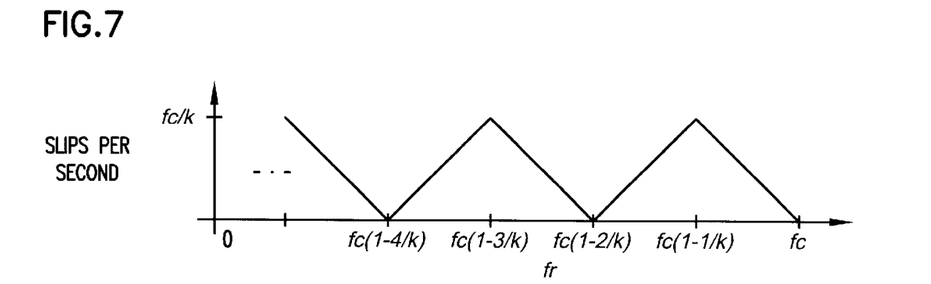
FIG. 7 illustrates graphically a simple frequency detector characteristic.

This system acts as a simple frequency detector, reporting when phase slips between $f_c$ and $f_r$ of $2\pi$ occur. The frequency detector is linear in the range $$f_c\left(1 - \frac{p+1}{k}\right) < f_r < f_c\left(1 - \frac{p}{k}\right) \quad (14)$$

and has negative slope if p is even, positive slope if p is odd. A plot of the frequency detector characteristic is given in FIG. 7.

Figure 8:
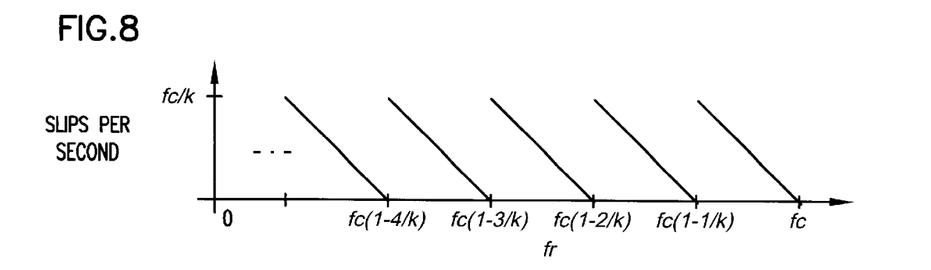
FIG. 8 illustrates graphically a modified simple frequency detector characteristic.

In a preferred embodiment of the digital frequency detector for square waves, each individual simple frequency detector is modified slightly. If p is odd the action of not reporting a slip event and reporting a slip event are swapped, i.e. a slip event is reported when a sampling period contains p+1 2π/k slips and not reported when it contains p 2π/k slips. In this way the frequency detector characteristic always has a negative slope, as shown in FIG. 8.

Only one in k samples is used by the frequency detector, so using the same sampler and sampling rate an array of l frequency detectors can be constructed where $$1 \leq l \leq k \quad (15)$$

The frequency detectors operate sequentially using subsequent samples from the sampler. Each frequency detector has a memory element to store its previous sample, which occurred k samples before its current sample. The output of each frequency detector is only observed at the appropriate time. A possible realisation of this array of frequency detectors is shown in FIG. 9.

Figure 9:
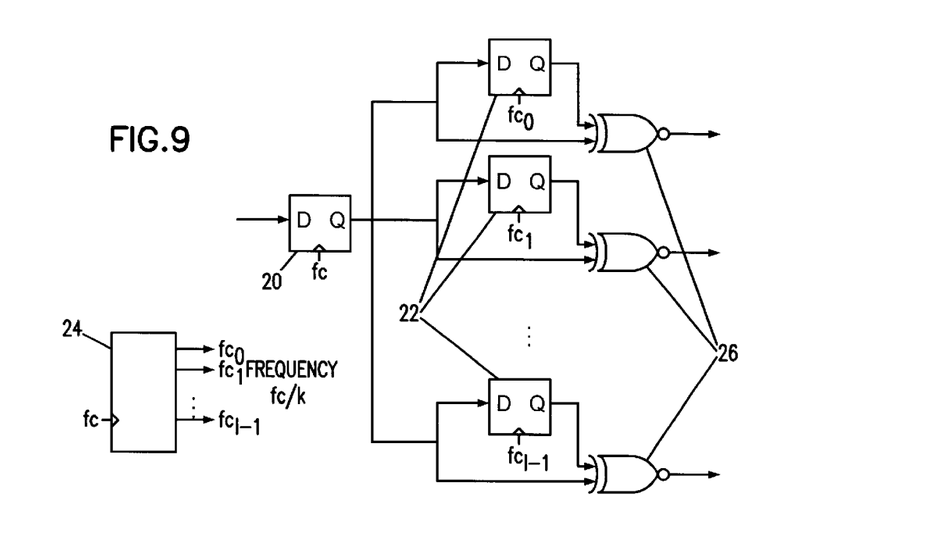
FIG. 9 is a digital circuit diagram for a possible realisation of a simple frequency detector array.

With reference to FIG. 9, the divided down signal reference square wave is sampled by flip flop 20. The individual frequency detectors each have their own flip flops 22 for storing the last sample. These storage flip flops 22 are clocked once every k $f_c$ clock periods with phased clocks generated by the phased clock generation block 24. Exclusive OR gates 26 plus inversion determine if a slip event has 25 occurred. Note that the output of each frequency detector is only observed when the sampler holds the sample for the particular frequency detector, i.e. only one $f_c$ clock period out of k $f_c$ clock periods.

Figure 10:
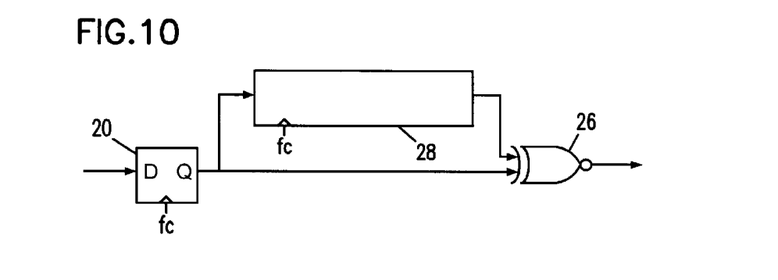
FIG. 10 is a digital circuit diagram of a more efficient possible realisation of a simple frequency detector array.

When the simple frequency detectors use l successive samples from the sampler, then a much more hardware efficient realisation, shown in FIG. 10, can be used. Here, the Exclusive OR gate 26 plus inversion is shared between the frequency detectors, as each frequency detector only needs it once every k $f_c$ clock periods, to report whether or not it detected a slip event. The output of the array of frequency detectors is a stream of bits, indicating if a frequency detector has detected a slip event. The memory elements are implemented with a shift register 28. For large 1 a denser form of memory may be more appropriate. The sampler 20 samples the divided down signal reference. Note also that the output of the array of frequency detectors is observed for only l out of the k $f_c$ clock periods.

Figure 11:
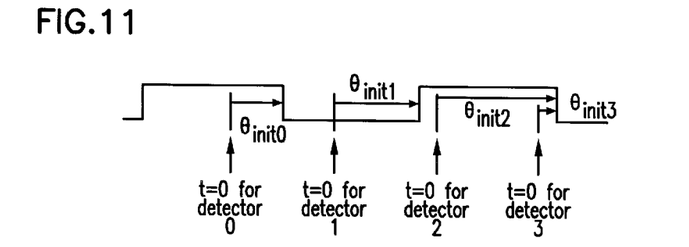
FIG. 11 illustrates graphically different start phases of each of the frequency detectors in the array.

The start time (i.e. t=0) of each frequency detector in the array is in fact a different physical time, each physical start time is separated by 1/$f_c$ seconds (depending on how the l of k sampling instants are chosen). And hence the start phase with respect to the signal reference of the sampling process of each frequency detector, $\theta_{init}$, is different. These different start phases are illustrated in FIG. 11. The $\theta_{init}$ for each frequency detector can be determined given the $\theta_{init}$ for one frequency detector, $f_r$ and $f_c$ and the way the l of k sampling instants are chosen. For the simple case where l successive samples are used, the start phases are $$\theta_{initi} = \theta_{init0} - 2\pi \frac{f_r}{f_c} i + 2\pi \left[1 - \frac{\theta_{init0}}{2\pi} + \frac{f_r}{f_c} i\right] \quad (16)$$

$$i \in [1, 2, \ldots l-1] \quad (17)$$

Figure 12:
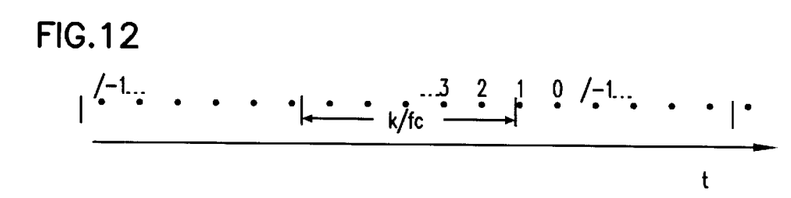
FIG. 12 illustrates slip event time instants for all the frequency detectors in a single array.

The $\theta_{init}$ will be distributed in some manner across 0, 2π radians. By a judicious choice of l, k, $f_r$ and $f_c$ the distribution of the $\theta_{init}$ across 0, 2π, can be made relatively uniform. The slip event instants for each frequency detector are given by equation (12). The slip event time instants for all the frequency detectors in the array are shown in FIG. 12. Here the start time for each frequency detector is placed at zero. The sampling period k/$f_c$ is shown also, and the sampling period boundaries for each frequency detector start at time zero.

The system observing the output of the array of frequency detectors will see a number of the l frequency detectors reporting slip events in a k/$f_c$ sampling period. The number of slip events reported is the number of slip event instants enclosed between the two boundaries of the particular sampling period, as seen in FIG. 12. For the case where start phases are uniformly distributed across 0, 2π radians, each slip event reported indicates that the signal has slipped past the sampling clock by 2π/l radians. The average number of slip events per sampling period is $$N_{ave} = l\left(k - p - \frac{f_r}{f_c}k\right) \quad (18)$$

Figure 13:
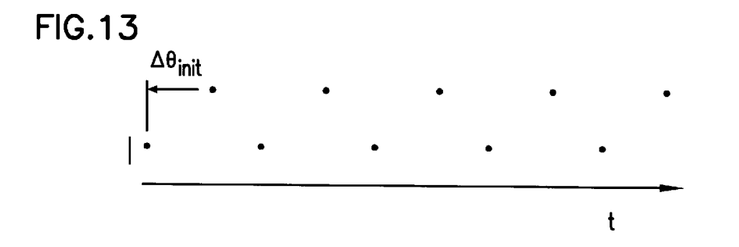
FIG. 13 illustrates slip event time instants for all the frequency detectors in two arrays, the reference waveform and the signal waveform respectively.

Now consider two arrays of frequency detectors, detector array A and detector array B, both using the same sampling clock of frequency $f_c$. Detector array A is sampling the reference of frequency $f_r$ and detector array B is sampling the signal to be measured with frequency $f_s$. Assume that the first signal slip event instant leads the first signal reference slip event instant as shown in FIG. 13.

$$0 \leq \Delta\theta_{init} \leq \frac{2\pi}{l} \quad (19)$$

The stream of slip events from detector array A is combined with the stream of slip events from detector array B to form a ternary value of −1, 0, or 1, in the following way. If array A indicates a slip event and array B doesn't then −1 is output. If array B indicates a slip event and array A doesn't then 1 is output. If both array A and B indicate a slip event or no slip event then 0 is output. So the stream of slip events from detector array A is effectively subtracted from the stream of slip events from detector array B. This ternary value is accumulated to form the number N. N is observed at the end of a k/$f_c$ sampling period, after all the l simple frequency detectors in detector array A and B have had an opportunity to report a slip event.

If $f_s$ is equal to $f_r$ then depending on how the sampling period boundaries fall between the slips, N will be either one or zero.

If $f_s$ is slightly less than $f_r$ then the period between slip events (equation (12)) will be reduced. N will be eventually observed to have a value of two as the reference slowly slips past the signal. The increase in reference phase over the signal that will have occurred before a two is observed will depend on how the sampling period boundaries fall between the slip events. But, it will be in the following range $$\frac{2\pi}{l} - \Delta\theta_{init} \le \Delta\theta \le \frac{4\pi}{l} - \Delta\theta_{init} \quad (20)$$

This assumes that the start phases of the frequency detectors are not changed significantly by the frequency difference. So a count of two indicates that a phase slip of approximately $2\pi/l$ has occurred between the signal and signal reference. When a two is observed the slip can be noted, and N reset to one. Subsequent observations of N being two indicate that further phase slips of exactly $2\pi/l$ have occurred between signal and reference, assuming the sampling period boundaries always fall in the same place between the slip events.

Similarly if $f_s$ is slightly greater than $f_r$ then the period between slip events (equation (12)) will be increased. N will be eventually observed to have a value of minus one as the signal slowly slips past the reference. The increase in signal phase over the reference that will have occurred before a minus one is observed will depend on how the sampling period boundaries fall between the slip events. But, it will be in the following range $$\Delta\theta_{init} \le \Delta\theta \le \frac{2\pi}{l} + \Delta\theta_{init} \quad (21)$$

This assumes that the start phases of the frequency detectors are not changed significantly by the frequency difference. So a count of minus one indicates that a phase slip of approximately $2\pi/l$ has occurred between the signal and the reference. When a minus one is observed the slip can be noted, and N reset to zero. Subsequent observations of N being minus one indicate that further phase slips of exactly $2\pi/l$ have occurred between signal and reference, assuming the sampling period boundaries always fall in the same place between the slip events.

So in the manner just described phase slips between the signal and reference waveforms of order $2\pi/l$ can be detected. The output of the digital frequency detector is this information about phase slips between the signal and reference waveforms. The system observing the output of the digital frequency detector, can determine the sign of the frequency difference from the phase slip direction and, the magnitude of the frequency difference from the number of slips per unit time.

If the assumption made earlier that the signal slip events lead the reference slip events is incorrect, then an erroneous indication of a phase slip will occur at start-up. After start-up though, with N being reset to zero, the assumption of the signal slip events leading the signal reference slip events will then be true. Operation can then continue in the manner just described. In many applications the reference waveform will not exist. Instead the digital frequency detector for square waves will simply generate a stream of slip events that has the same number of slip events per second as if there were a signal reference of frequency $f_r$ and initial phase as given in equation (5).

Figure 14:
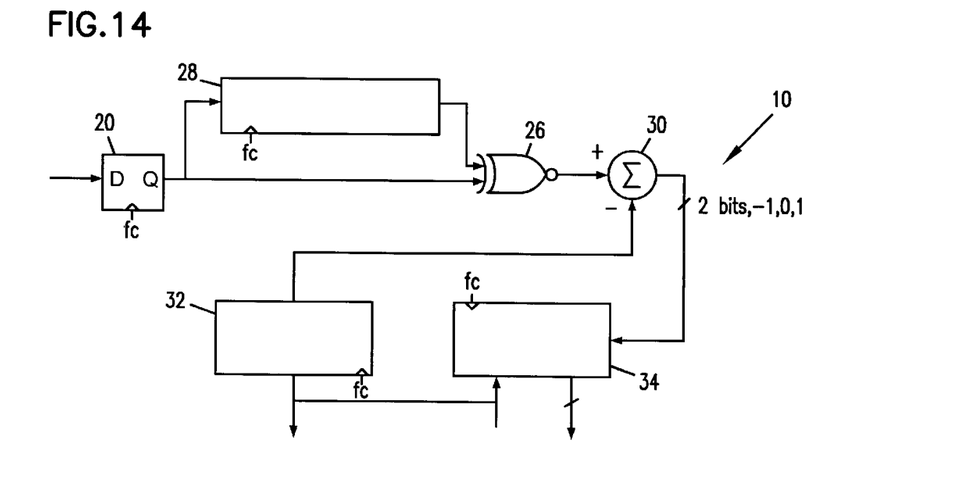
FIG. 14 illustrates a digital circuit diagram of a possible realisation of a digital frequency detecting apparatus in accordance with the invention.

A possible realisation of a typical digital frequency detector for square waves is shown in FIG. 14 and shows the key elements of the digital frequency detector 10 for square waves just described. This realisation incorporates the frequency detector array from FIG. 10. Typically the simple flip flop 20 which samples the divided down signal, will be replaced by a system of flip flops to reduce failure due to metastability to an insignificant amount. But the function will be the same as the flip flop 20. The array of simple frequency detectors is made using a shift register 28 and an Exclusive OR gate 26 plus inversion as before. Logic gates 30 are used to subtract the frequency detector array slip events from the slip events generated by a counter 32. The resultant ternary value is used to form N in an accumulator 34.

The signal frequency may be sufficiently different from the reference frequency to cause a significant change in the start phases of the frequency detectors, possibly causing the start phases to be unevenly distributed across $0,2\pi$. When this is true the digital frequency detector for square waves may no longer accurately indicate the magnitude of the phase slips. Careful choice of $f_c$ to ensure that the start phases are uniformly distributed for a range of signal frequencies may enable the digital frequency detector for square waves to be used over a wider range of frequencies.

An example of choosing $f_c$ for uniformly distributed start phases is now given. Phase slips of $2\pi/100$ are to be detected in a signal of nominal frequency 10 MHz. Hence one hundred simple frequency detectors are required in the frequency detector arrays. The array of frequency detectors will employ the simple method where one hundred successive samples are used. To ensure that the one hundred start phases are uniformly distributed, the value $$T_d = \frac{1}{f_r} - \frac{1}{f_c} \quad (22)$$

should satisfy the following two conditions $$100 f_r T_d \epsilon Z^+ \quad (23)$$

$$j f_r T_d \notin Z^+ \quad (24)$$

$$j \epsilon [1,2,\ldots,99] \quad (25)$$

In this particular case, some values for $f_c$ which satisfy equations (23) and (24) are 1/99 ns, 1/97 ns, 1/93 ns, 1/91 ns, 1/89 ns, 1/87 ns etc.

It is interesting to note that for the digital frequency detector for square waves to be able to detect small phase changes it cannot be clocked at rate $f_r$. If it were to be clocked at rate $f_r$, the starting phase diversity between the individual frequency detectors would not be possible, and phase slips of size $2\pi$ could only be detected. The individual frequency detectors should also operate in their linear region as defined by equation (14). So given k, l, $f_r$, is and an expected $f_s$, $f_c$ should be chosen to ensure that the frequency detectors are maintained in their linear region.

The speed at which the digital frequency detector for square waves can detect a phase slip has occurred is the sampling period $k/f_c$. For many applications the restrictions placed on $f_c$ by equation (2), will result in a speed or frequency of detection which is much higher than necessary. For these applications it may be desirable to clock the digital frequency detector for square waves at a much lower rate than given by equation (2). To enable clocking of the digital frequency detector for square waves at a rate $f_{cn}$ which is n times slower, n an integer $$f_{cn} = \frac{f_c}{n} \quad (26)$$

l, which determines the smallest phase slip that can be detected, needs to be chosen n times greater than desired. The digital frequency detector for square waves clocked at $f_{cn}$ is equivalent to a digital frequency detector for square waves being clocked at $f_c$, but with only every $n^{th}$ simple frequency detector being observed. Again, $f_c$ and n must be carefully chosen to ensure that the start phases of the l/n frequency detectors are uniformly distributed across 0, $2\pi$.

Where a higher phase slip detection frequency is required, the digital frequency detector for square waves can be clocked at a higher rate than imposed by equation (2). Discussion of a higher speed system is given below. Also, where the signal input square wave has a sufficiently good mark space ratio, for example if the signal is the output of an IF (intermediate frequency) filter, then the dividing down of the signal by two may be omitted. This action effectively doubles $f_r$, and so $f_c$ also needs to be doubled.

The serial realisation of the digital frequency detector for square waves described above requires k $f_c$ clock cycles to be able to detect phase slips between the signal reference and signal of the order of $2\pi/k$ radians. In some applications a much faster measurement of frequency will be required. The digital frequency detector's simple frequency detectors need to have evenly spread starting phases with respect to the signal being measured. In the last section these diverse starting phases were achieved using the periodicity of the sampling clock $f_c$ and the reference $f_r$. Another technique to obtain diverse starting phases is to delay the reference waveform by various amounts, before it is sampled by the individual frequency detectors in the array. A possible realisation of this technique is shown in FIG. 15.

Figure 15:
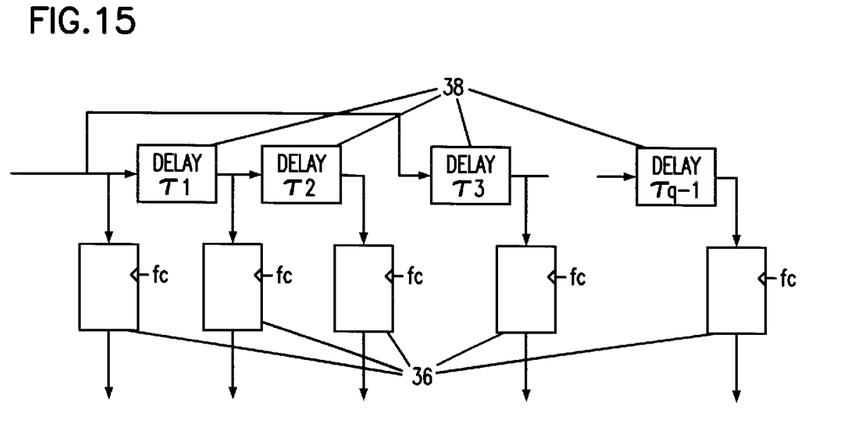
FIG. 15 is a block diagram of a further embodiment of a digital frequency detector.
Figure 16:
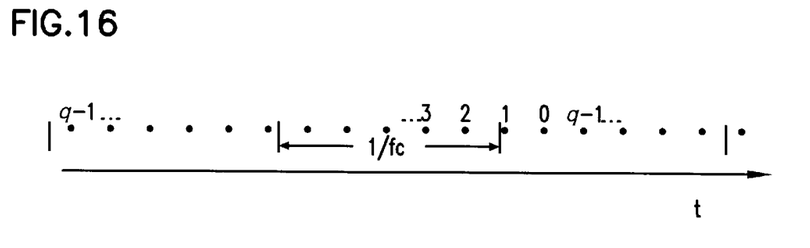
FIG. 16 illustrates graphically the slip event time instants for all the simple frequency detectors in the array of FIG. 15.

With reference to FIG. 15, each of q simple frequency detectors 36 are clocked at rate $f_c$. It is possible to have $f_c$ equal to $f_r$, but, since the frequency detectors are very efficiently realised when $f_c$ is offset from $f_r$, $f_c$ is chosen to satisfy equation (2). The reference is delayed by delay elements 38 to obtain diverse start phases. Each simple frequency detector 36 starts at time zero with its own starting phase $\theta_{initi}$ with respect to the start phases of the other frequency detectors. The starting phase of each frequency detector depends on the time the signal reference is delayed. The delays should be chosen to give an even distribution of the starting phases across 0, $2\pi$. The instants when $f_c$ slips past $f_r$, by one cycle, for each frequency detector, are given by equation (6). FIG. 16 shows the slip event instants for all the frequency detectors in the array of FIG. 15.

The average number of slip events reported per sampling clock period is $$N_{avep} = q\left(1 - \frac{f_r}{f_c}\right) \quad (27)$$

The detection of phase slips between the reference waveform (real or just generated slip events) and the signal of the order of $2\pi/q$, is similar to the serial realisation illustrated in FIG. 14. The difference is that instead of just a ternary value being accumulated each sampling clock period, a value of much larger magnitude is accumulated. Also, the state of the accumulator N is observed every sampling clock period, not every k sampling clock periods, and q is substituted for l in equations (20) and (21).

An alternate scheme to delaying the reference waveform by various amounts, is to delay the clocks to the simple frequency detectors. Again the various delays for the clocks will need to be chosen to ensure an even distribution of start phases. Operation is identical to the parallel realisation just described. Hence small changes in phase between the reference and the signal waveforms can be detected in just one sampling clock period. However, more hardware is required and the accuracy with which the delay elements can be manufactured will typically limit the number of frequency detectors q.

A compromise between the slow serial method and fast parallel realisation can be obtained by replacing the simple frequency detectors 36 shown in FIG. 15 with arrays of detectors realised serially as described above. With this method it is possible to detect phase changes of the order of $2\pi/(ql)$, in k sampling clock periods. Again the start phases of all the ql frequency detectors must be evenly spread across 0,$2\pi$. In some systems the sampling clock rate $f_c$ may be able to run at a much higher rate than the signal reference frequency $f_r$. In these systems it is possible to sample q times higher than the limit imposed by equation (2). One approach would be to have phased clocks derived from the clock at rate $qf_c$, clocking the samplers of the q parallel frequency detectors (See FIG. 17).

Figure 17:
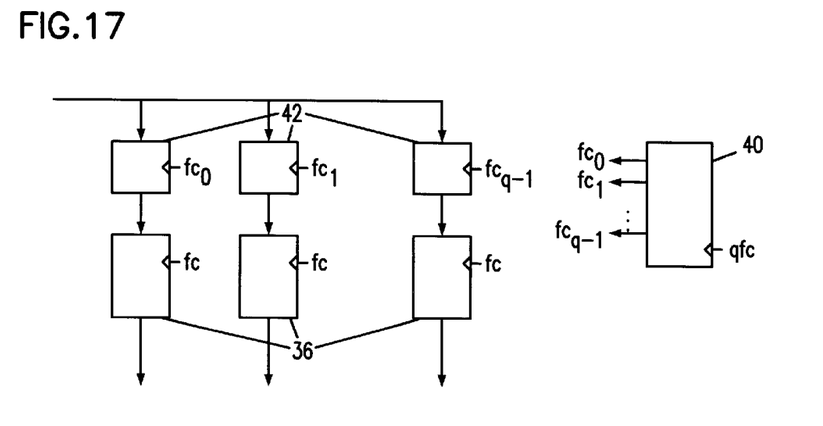
FIG. 17 is a block diagram of yet another embodiment of a digital frequency detector.

With reference to FIG. 17 phased clocks with frequency $f_c$ are generated by the phased clock generator 40. Samplers 42 (normally just flip flops) sample the reference waveform and are clocked with different phased clocks of frequency $f_c$. The outputs of the samplers are fed to simple frequency detectors 36. These may be replaced with arrays of detectors realised serially as described above to detect smaller phase changes. Alternatively if the whole frequency detector system can run at this higher frequency $qf_c$, then the serial realisation of the digital frequency detector for square waves (as shown in FIG. 14) can be used with the sampling clock being $qf_c$. The sampling period will be kq sampling clock periods.

Figure 18:
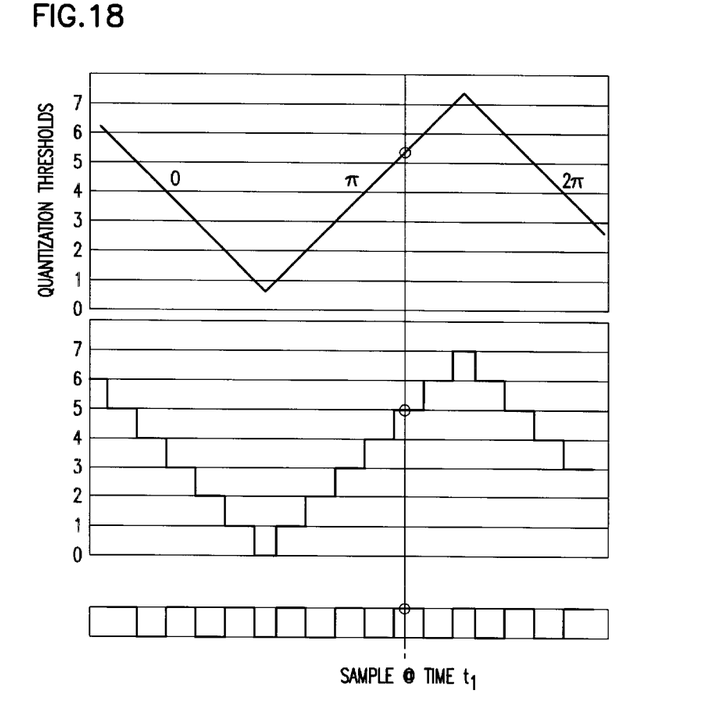
FIG. 18 shows sampling of a triangular waveform for frequency detection in accordance with an embodiment of the invention.

An embodiment of the digital frequency detector for use with triangular waves will now be described. A triangular wave of frequency $f_r$ and a quantised version of the triangular waveform are shown in FIG. 18. The quantizer has W levels, in this case W equals eight. A square wave of frequency (W-1) $f_r$ can be formed by observing the least significant bit (LSB) of the quantised value. With the triangular wave amplitude and its position with respect to the quantisation thresholds as shown in FIG. 18, the square wave has a 50/50 mark space ratio over the entire period of the triangular wave.

A simple frequency detector that will be used in the digital frequency detector for use with triangular waves, contains an analog to digital converter (ADC), that samples the triangular wave at discrete times. The discrete sample times are related to the clock of frequency $f_c$ which drives the digital frequency detector. A sample at time $t_l$ is shown in FIG. 18. The sample is quantised by the ADC to a three bit binary value in this example. The rest of the simple frequency detector only observes the LSB of the quantised sample. So apart from the ADC, the triangular wave appears like a square wave of frequency 2(W-1)$f_r$ to the simple frequency detector. (The factor of two arises because the square wave can not be divided by two as was done in the previous example). So the same methods described above to measure the frequency of a square wave can be used in the rest of the digital frequency detector for use with triangular waves.

In summary, the simple frequency detectors used in the digital frequency detector for triangular waves require an ADC to sample and quantise the triangular waveform. But, the rest of the digital frequency detector for triangular waves is identical to a digital frequency detector for square waves, designed for a square wave of frequency 2(W-1)$f_r$. With arrays consisting of 1 simple frequency detectors, phase slips of the order $2\pi/2(W-1)l$ between the signal and reference triangular waves can be detected.

An example will now be described which demonstrates the use of the digital frequency detector for a particular application, namely, narrow band FM demodulation.

A particular 4 level PAM/FM modulation format transmits a 2 bit symbol by transmitting one of four frequencies, as shown in Table 1

TABLE 1

Symbol Alphabet

| Nominal Frequency | Symbol |
|---|---|
| carrier + 4687.5 Hz | 10 |
| carrier + 1562.5 Hz | 11 |
| carrier − 1562.5 Hz | 01 |
| carrier − 4687.5 Hz | 00 |

Figure 19:
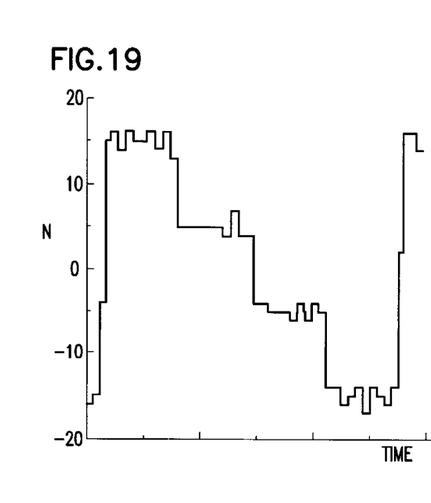
FIG. 19 illustrates an output of a digital frequency detector realisation employed in PAM/FM demodulation.
Figure 20:
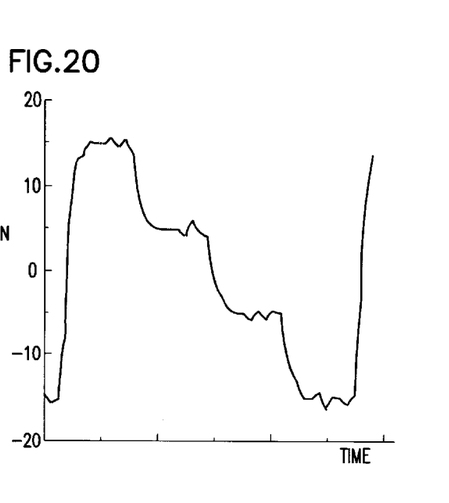
FIG. 20 illustrates a low pass filtered version of the output shown in FIG. 20.

The symbol rate is 3.125 kbaud. It is desired to detect phase changes in the FM signal of the order of 2 π/100, at a rate ten times the symbol rate. Hence the sampling rate $f_{cn}$ will need to be of the order of 3 MHz. in this particular case the IF frequency (which sets $f_r$) is 10 MHz. Note that even if the IF frequency were much higher, the digital frequency detector will still only need to be clocked at around 3 MHz. l/n needs to be 100. $f_{cn}$ is chosen to be 1/293 ns, i.e. 3.41297 MHz. k/n is chosen to be 107. n is 3. The digital frequency detector realisation to perform the demodulation is identical to the one shown in FIG. 14. The output of the digital frequency detector is shown in FIG. 19, and a low pass filtered version of this output is shown in FIG. 20. Notice that there is some ripple on the digital frequency detector output, since the start phases are no longer perfectly distributed.

The embodiments of the digital frequency detector for square waves described above has the following important advantages over the prior art techniques for measuring the frequency of a square wave:

(i) Arbitrarily small phase changes between the signal and reference square waves can be detected, irrespective of the rate at which the digital frequency detector for square waves is clocked.

(ii) The digital frequency detector for square waves is constructed entirely from digital components. For many applications the digital frequency detector will permit the removal of analog subsystems or high speed analog to digital converters used for frequency detection. Being totally digital, precision components or tuning at time of manufacture is not required. And, with the output of the digital frequency detector being in digital form it can be stored or manipulated with great ease.

(iii) The components required to construct the digital frequency detector for square waves are readily available digital components such as logic gates and flip flops. This allows the digital frequency detector to be easily integrated using digital integrated circuit technology.

Numerous variations and modifications may suggest themselves to persons skilled in the digital communications and electronics arts, in addition to those already described, without departing from the basic inventive concepts. For example, with minor modifications the invention can be applied to many diverse areas of electronics which involve the modulation and demodulation of angle modulated signals, frequency synthesis, or accurate measurement of the frequency difference between signals. All such variations and modifications are to be considered within the scope of the present invention, the nature of which is to be determined from the forgoing description and the appended claims.

The claims defining the invention are as follows:

1. A digital frequency detecting apparatus for detecting small frequency differences between an unknown signal waveform and a reference waveform, the apparatus comprising:
    means for digitally generating reference slip events effectively indicative of phase slips between the reference waveform and a sampling clock signal;
    means for digitally generating signal slip events effectively indicative of phase slips between the signal waveform and the sampling clock signal;
    means for digitally combining the reference slip events with the signal slip events to produce a digital output indicative of phase slips between the reference waveform and the signal waveform whereby, in use, the magnitude of a frequency difference between the signal and the reference waveforms can be determined from the number of phase slips per unit time.

2. A digital frequency detecting apparatus as defined in claim 1, wherein said means for generating reference slip events comprises an array of simple digital frequency detectors, each simple frequency detector only being capable of detecting a large phase slip between the reference waveform and the sampling clock signal, and each simple frequency detector in the array having a different starting phase with respect to the reference waveform.

3. A digital frequency detecting apparatus as defined in claim 1, wherein said means for generating reference slip events comprises a digital logic circuit designed to generate a stream of slip events as if there were a reference waveform present.

4. A digital frequency detecting apparatus as defined in claim 1, wherein said means for generating signal slip events comprises an array of simple digital frequency detectors, each simple frequency detector only being capable of detecting a large phase slip between the signal waveform and the sampling clock signal, and each simple frequency detector in the array having a different starting phase with respect to the signal waveform.

5. A digital frequency detecting apparatus as defined in claim 4, wherein said combining means effectively subtracts the stream of reference slip events from the stream of signal slip events to produce an output indicative of phase slips between the reference waveform and the signal waveform.

6. A digital frequency detecting apparatus as defined in claim 5, wherein each of said simple frequency detectors comprises a memory element for storing a previous sample and an Exclusive OR gate with inversion to determine if a slip event has occurred.

7. A digital frequency detecting apparatus as defined in claim 6, wherein the memory elements in each simple frequency detector are flip flops clocked at predetermined periods with phased clock signals generated by a phased clock generation means.

8. A digital frequency detecting apparatus as defined in claim 4, wherein a single Exclusive OR gate with inversion is shared between all the simple frequency detectors and the memory elements are implemented with a shift register.

9. A digital frequency detecting apparatus as defined in claim 4, wherein said means for generating signal slip events further comprises a digital sampling circuit for sampling the signal waveform at a frequency determined by said sampling clock signal.

10. A digital frequency detecting apparatus as defined in claim 4, wherein said means for generating signal slip events further comprises a plurality of digital delay elements adapted to delay the signal waveform supplied to each simple digital frequency detector in the array, said delay elements providing delays selected to give an even distribution of start phases for each simple frequency detector across o, 2π.

11. A digital frequency detecting method for detecting small frequency differences between an unknown signal waveform and a reference waveform, the method comprising:

digitally generating reference slip events effectively indicative of phase slips between the reference waveform and a sampling clock signal;

digitally generating signal slip events effectively indicative of phase slips between the signal waveform and the sampling clock signal; and, digitally combining the reference slip events with the signal slip events to produce a digital output indicative of phase slips between the reference waveform and the signal waveform whereby, in use, the magnitude of a frequency difference between the signal and reference waveforms can be determined from the number of phase slips per unit time.

12. A digital frequency detecting method as defined in claim 11, wherein said step of digitally generating reference slip events is effected using an array of simple digital frequency detectors, each simple frequency detector only being capable of detecting a large phase slip between the reference waveform and the sampling clock signal, and each simple frequency detector in the array having a different starting phase with respect to the reference waveform.

13. A digital frequency detecting method as defined in claim 11, wherein said step of digitally generating reference slip events involves the digital generation of slip events, as if there were a reference waveform present.

14. A digital frequency detecting method as defined in claim 11, wherein said steps of digitally generating signal slip events is effected using an array of simple digital frequency detectors, each simple frequency detector only being capable of detecting a large phase slip between the signal waveform and the sampling clock signal, and each simple frequency detector in the array having a different starting phase with respect to the signal waveform.

15. A digital frequency detecting method as defined in claim 11, wherein said step of digitally combining involves effectively subtracting the stream of reference slip events from the stream of signal slip events to produce an output indicative of phase slips between the reference waveform and the signal waveform.

* * * * *